(12) United States Patent
Jalics et al.

(10) Patent No.: US 12,111,578 B2
(45) Date of Patent: Oct. 8, 2024

(54) MIRROR FOR AN ILLUMINATION OPTICAL UNIT OF A PROJECTION EXPOSURE APPARATUS COMPRISING A SPECTRAL FILTER IN THE FORM OF A GRATING STRUCTURE AND METHOD FOR PRODUCING A SPECTRAL FILTER IN THE FORM OF A GRATING STRUCTURE ON A MIRROR

(71) Applicant: Carl Zeiss SMT GmbH, Oberkochen (DE)

(72) Inventors: Christof Jalics, Heidenheim (DE); Fabian Schuster, Bad Buchau (DE); Holger Kierey, Aalen (DE); Andreas Sandner, Aalen (DE); Tobias Meisch, Essingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 534 days.

(21) Appl. No.: 17/317,417

(22) Filed: May 11, 2021

(65) Prior Publication Data
US 2021/0263423 A1 Aug. 26, 2021

Related U.S. Application Data

(63) Continuation of application No. PCT/EP2019/082407, filed on Nov. 25, 2019.

(30) Foreign Application Priority Data

Nov. 29, 2018 (DE) .......................... 102018220629.5

(51) Int. Cl.
G03F 7/00 (2006.01)
G02B 5/08 (2006.01)
G02B 5/18 (2006.01)

(52) U.S. Cl.
CPC ....... *G03F 7/70166* (2013.01); *G02B 5/0891* (2013.01); *G02B 5/1861* (2013.01); *G03F 7/70191* (2013.01); *G03F 7/702* (2013.01)

(58) Field of Classification Search
CPC .. G02B 27/425; G02B 5/0891; G02B 5/1861; G02B 27/1086; G02B 27/1093;
(Continued)

(56) References Cited

U.S. PATENT DOCUMENTS 5,907,436 A 5/1999 Perry et al.
6,522,465 B1 2/2003 Goldstein
(Continued)

FOREIGN PATENT DOCUMENTS

DE 10 2012 010 093 A1 11/2013
DE 10 2016 213 839 A1 12/2016
(Continued)

OTHER PUBLICATIONS

German examination report, with translation thereof, for corresponding DE Appl 10 2018 220 629.5, dated May 15, 2019.
(Continued)

*Primary Examiner* — Deoram Persaud
(74) *Attorney, Agent, or Firm* — Fish & Richardson P.C.

(57) ABSTRACT

A mirror for an illumination optical unit of a projection exposure apparatus comprises a spectral filter in the form of a grating structure, wherein the grating structure has a maximum edge steepness in the range of 15° to 60°.

24 Claims, 9 Drawing Sheets

(58) Field of Classification Search
CPC ...... G02B 5/1838; G02B 5/1857; G02B 6/00;
G02B 6/29313; G02B 6/29314; G03F
7/70158; G03F 7/70166; G03F 7/70191;
G03F 7/702; G03F 7/70575; G03F
7/70025; G03F 7/70033; G03F 7/70208;
G03F 7/70316; G03F 7/7055; G03F
7/70566; G03F 7/70991; H01S 3/0903
See application file for complete search history.

(56) References Cited

U.S. PATENT DOCUMENTS

| | | | |
|---|---|---|---|
| 6,524,756 | B1 | 2/2003 | Wu |
| 9,435,921 | B2* | 9/2016 | Sun .................. G02B 1/12 |
| 9,671,534 | B2* | 6/2017 | Neauport .............. G02B 5/1866 |
| 10,599,041 | B2 | 3/2020 | Bieling et al. |
| 11,480,724 | B2* | 10/2022 | Evans .................. G02B 6/0016 |
| 2004/0051954 | A1* | 3/2004 | Bristol ................. G02B 5/1838 |
| | | | 359/634 |
| 2009/0267003 | A1* | 10/2009 | Moriya .................. G21K 1/062 |
| | | | 250/492.2 |
| 2010/0202057 | A1* | 8/2010 | Neauport .............. B82Y 20/00 |
| | | | 359/572 |
| 2012/0300302 | A1* | 11/2012 | Bonod ................. G02B 5/1861 |
| | | | 359/569 |
| 2014/0085619 | A1* | 3/2014 | Banine .................. B82Y 10/00 |
| | | | 355/71 |
| 2015/0049321 | A1* | 2/2015 | Bieling .............. G02B 19/0047 |
| | | | 355/71 |
| 2022/0221629 | A1* | 7/2022 | Nienhuys ............. G02B 5/1861 |
| 2022/0236461 | A1* | 7/2022 | Van De Kerkhof ........................ |
| | | | G03F 7/70316 |

FOREIGN PATENT DOCUMENTS

| | | |
|---|---|---|
| EP | 3 076 208 A1 | 10/2016 |
| JP | 2002-196320 A | 7/2002 |
| JP | 2010-514204 A | 4/2010 |
| JP | 2011-523782 A | 8/2011 |
| JP | 2012-235046 A | 11/2012 |
| JP | 2018-529117 A | 10/2018 |
| TW | 201106032 A | 2/2011 |
| TW | 201812275 A | 4/2018 |
| WO | WO 2008/079008 A2 | 7/2008 |
| WO | WO 2009/144117 A1 | 12/2009 |
| WO | WO 2017/036717 A2 | 3/2017 |

OTHER PUBLICATIONS

International Search Report and Written Opinion for corresponding Appl No. PCT/EP2019/082407, dated Jun. 26, 2020.
Dehdast, Mayhar et al. "A novel trapezoidal profile of optimized diffraction grating for light trapping in thin silicon solar cells", Optica Applicata, Jan. 1, 2017.
Japanese Office Action, with English translation thereof, for corresponding JP Appl No. 2021-530830, dated Oct. 16, 2023.
Taiwanese Office Action, with English translation thereof, for corresponding TW Appl No. 108143436, dated Jun. 12, 2023.
Taiwanese Office Action, with English translation thereof, for corresponding TW Appl No. 108143436, dated Sep. 27, 2023.
European Office Action for corresponding EP Appl No. 19 809 068.0, dated May 14, 2024.
Mahyar Dehdast et al.: "A novel trapezoidal profile of optimized diffraction grating for light trapping in thin silicon solar cells", Optica Applicata, Jan. 1, 2017 (Jan. 1, 2017), XP055461187, DOI: 10.5277/oa170107 Retrieved from the Internet: URL:http://opticaapplicata.pwr.edu.pl/files/pdf/2017/no1/optappl_4701p75.pdf [retrieved on Apr. 8, 2024].
Jaeyoun Kim et al.: "Design and Fabrication of Low-Loss Hydrogenated Amorphous Silicon Overlay DBR for Glass Waveguide Devices", IEEE Journal of Selected Topics in Quantum Electronics, IEEE, USA, vol. 8, No. 6, Nov. 1, 2002 (Nov. 1, 2002), XP011066223.
Lockhart R et al.: "High-efficiency MEMS tuneable gratings for external cavity lasers and microspectrometers", Optical mems and Nanophotonics, 2008 IEEE/LEOS International Conference on, IEEE, Piscataway, NJ, USA, Aug. 11, 2008 (Aug. 11, 2008), pp. 33-34, XP031313066.
Knop K et al.: "Microfabrication and evaluation of diffractive optical filters prepared by reactive sputter etching", Journal of Applied Physics, American Institute of Physics, 2 Huntington Quadrangle, Melville, NY 11747, vol. 50, No. 6, Jun. 1, 1979 (Jun. 1, 1979), pp. 3841-3848, XP001391878.
Svakhin A.S. et al.: Investigation of the formation of diffraction gratings on the surface of optical waveguides, Soviet Journal of Quantum Electronics, American Institute of Physics, New York, NY, US, vol. 9, No. 5, May 1, 1979 (May 1, 1979), pp. 645-647, XP001624131.

\* cited by examiner

MIRROR FOR AN ILLUMINATION OPTICAL UNIT OF A PROJECTION EXPOSURE APPARATUS COMPRISING A SPECTRAL FILTER IN THE FORM OF A GRATING STRUCTURE AND METHOD FOR PRODUCING A SPECTRAL FILTER IN THE FORM OF A GRATING STRUCTURE ON A MIRROR

CROSS-REFERENCE TO RELATED APPLICATIONS

The present application is a continuation of, and claims benefit under 35 USC 120 to, international application PCT/EP2019/082407, filed Nov. 25, 2019, which claims benefit under 35 USC 119 of German Application No. 10 2018 220 629.5, filed Nov. 29, 2018. The entire disclosures of these applications are incorporated by reference herein.

FIELD

The disclosure relates to a mirror for an illumination optical unit of a projection exposure apparatus. The disclosure furthermore relates to a method for producing a spectral filter in the form of a grating structure on a mirror for an illumination optical unit. Moreover, the disclosure relates to an illumination optical unit and an illumination system for a projection exposure apparatus, and a projection exposure apparatus. In addition, the disclosure relates to a method for producing a microstructured or nanostructured component and to a component produced according to the method.

BACKGROUND

The use of a grating structure as spectral filter is known for example from DE 10 2012 010 093 A1.

SUMMARY

The disclosure seeks to provide an improved a grating structure, for example a mirror for an illumination optical unit comprising such a grating structure.

In an aspect, the disclosure provides a mirror for an illumination optical unit of a projection exposure apparatus. The mirror includes a spectral filter in the form of a grating structure. The grating structure has a plurality of grating ridges. The grating ridges each have a front side and sidewalls. A groove having a bottom is in each case formed between two grating ridges. The grating structure has a maximum edge steepness in the range of 15° to 60°.

The disclosure can involve forming the grating structure with a defined edge steepness. The edge steepness, for example the maximum edge steepness, of the grating structure, can be for example in the range of 15° to 60°, such as in the range of 30° to 45°.

The edge steepness is measured relative to a surface of the mirror, in particular to a tangent to the respective local surface of the mirror in the region between two grating ridges.

The edges of the grating structure can be formed without undercuts. The grating structure can have no etched undercut, for example.

According to the disclosure, it has been recognized that the grating structure can be better protected as a result. It is possible, for example, to form a mirror comprising a spectral filter in the form of a grating structure having a better durability.

For performance reasons, grating structures on a mirror for an illumination optical unit of a projection exposure apparatus are usually formed relatively steeply, for example, as far as possible perpendicularly, with respect to the mirror surface. Surprisingly, it has been found that for the issue of the durability of the grating structures, for example with regard to the hydrogen stability thereof, it can be advantageous to form the grating structures with a reduced edge steepness.

In accordance with an aspect of the disclosure, the grating structure is covered by a closed protective layer. The grating structure is in particular completely covered by a closed protective layer.

Penetration of harmful hydrogen into the grating structure can be prevented via the protective layer. It is thereby possible to prevent stresses in the material that may result in undesired layer detachments. In the case of a mirror substrate that includes a material which is attacked in a harmful hydrogen atmosphere, this material can be protected. Such materials can be for example tin, silicon or the compounds thereof.

In accordance with an aspect of the disclosure, the protective layer includes one or more plies comprising a constituent of molybdenum and/or silicon. The protective layer can also comprise constituents of copper, silver, platinum, gold, rhodium, a metal, an oxide or a combination of such substances or consist of corresponding substances. The protective layer can be composed of, for example, of a hydrogen-stable material. For example, a plurality of molybdenum-silicon double plies can serve as the protective layer. For example, a layer stack composed of a plurality of such plies, such as a plurality of such molybdenum-silicon double plies, can serve as the protective layer. The number of double plies can be in the range of 10 to 100, for example in the range of 30 to 80, such as in the range of 40 to 60.

Molybdenum-silicon double plies can be suitable for applications in the EUV range. The mirror can be, for example, a component of an EUV exposure apparatus.

According to the disclosure, it has been recognized that the molybdenum-silicon double plies on account of the defined edge steepness, can be applied on the grating structure without interruptions, that is to say in a closed layer, for example in a completely closed layer.

In accordance with an aspect of the disclosure, the grating structure is applied on a substrate or is introduced into a substrate, wherein the substrate includes one or more of the following materials or their compounds: amorphous silicon (a-Si), silicon dioxide ($SiO_2$), titanium (Ti), platinum (Pt), gold (Au), aluminium (Al), titanium oxide (TiOx, i.e. TiO or $Ti_2O_3$), nickel (Ni), copper (Cu), nickel-phosphorus (NiP), silver (Ag), tantalum (Ta), aluminium oxide ($Al_2O_3$).

For example, such materials have proved worthwhile for components of an EUV projection exposure apparatus.

In accordance with an aspect of the disclosure, the grating ridges each have a cross section having a trapezoid-shaped smallest convex envelope. The grating ridges can for example each have a trapezoid-shaped cross section. This should be understood to mean, in particular, that the part of the grating ridges which projects above a local tangential plane through a bottom of the adjacent grooves has a trapezoid-shaped cross section. This can involve an isosceles trapezoid or a non-isosceles trapezoid. In particular, a non-right-angled trapezoid can be used. In other words, the grating ridges can have a non-rectangular cross section having more than three vertices.

A trapezoid can be a proper, non-degenerate trapezoid. The grating ridges can have an at least quadrilateral cross section. They can each have a cross section having more than three vertices.

It is also possible to form the grating ridges with a cross section of a general quadrilateral. The front side of the grating ridges in particular need not necessarily be parallel to the bottom of the grooves adjacent to the respective grating ridge.

In accordance with an aspect of the disclosure, the front side of the grating ridges and/or the bottom of the grooves between adjacent grating ridges are/is embodied in each case in planar fashion. The front side of the grating ridges can be oriented in particular parallel to the bottom of the grooves.

In accordance with an aspect of the disclosure, the total area proportion constituted by the sidewalls of the grating ridges in a plan view, for example in a direction perpendicular to the front side of the grating ridges and/or in a direction perpendicular to the bottom of the grooves between adjacent grating ridges, is at most 10% (e.g., at most 5%, at most 3%, at most 2%, at most 1%, at most 0.5%, at most 0.3%). The total area proportion should be understood here to mean, in particular, that area proportion of the total reflection surface area of the mirror which is constituted by the sidewalls.

The proportion of the surface areas of the mirror which are oriented substantially perpendicular to a normal to the mirror, in particular are inclined by less than 150 (e.g., less than 10°, less than 5°, less than 3°, less than 2°, less than 10) with respect to a normal to a smallest convex envelope of all the grating ridges or with respect to a normal through a plane extending through the bottoms of the grooves between adjacent grating ridges, is in particular at least 90% (e.g., at least 95%, at least 97%, at least 98%, at least 99%, at least 99.5%, at least 99.7%) of the total reflection surface area of the mirror.

In accordance with an aspect of the disclosure, the mirror is a collector mirror or a condenser mirror.

The disclosure also seeks to provide an improved method for producing a spectral filter in the form of a grating structure on a mirror for an illumination optical unit of a projection exposure apparatus.

In an aspect, the disclosure provides a method that includes: providing a substrate for a mirror body; applying a structuring layer on the substrate; structuring the structuring layer; and structuring the substrate. One or more of the following method alternatives or combinations thereof is/are used for structuring the substrate: etching with a predefined etching angle in the range of 0° to 60°, for example in the range of 0° to 20°, wherein the etching angle in this case is the angle of incidence of the ions during etching, in particular the deviation thereof from the normal direction; etching, wherein structuring layer and substrate have different etching rates; and etching, wherein the structuring layer was provided with a sidewall steepness in the range of 100 to 900 during the structuring, wherein these angles are measured relative to the surface of the substrate. The method further includes applying a closed protective layer on the substrate.

The disclosure can involve producing a grating structure having a defined edge steepness, for example having an edge steepness in the range of 15° to 60°, via a targeted process implementation during the structuring of the substrate or a combination of a plurality of aspects thereof.

Potential advantages are evident from those described above.

The protective layer can for example grow on the substrate. In general, the substrate can be coated with the protective layer.

For features of the protective layer reference should be made to the description above.

A photoresist (PR) layer can serve as the structuring layer. In accordance with an aspect of the disclosure, one or more of the following method alternatives or combinations thereof can be used for structuring the substrate:

an inert dry etching method with an etching angle in the range of 0° to 60°, in particular in the range of 0° to 20°, wherein the etching angle in this case is the angle of incidence of the ions during etching, in particular the deviation thereof from the normal direction;

an inert dry etching method, wherein the structuring layer and the substrate have different etching rates;

an inert dry etching method, wherein the structuring layer was provided with a sidewall steepness in the range of 100 to 900 during the structuring, wherein these angles are measured relative to the surface of the substrate;

an inert dry etching method, wherein a ratio of the etching rates of substrate and structuring layer is set via various parameters such as e.g. etching angle or ion energy;

a reactive dry etching method, wherein a ratio of the etching rates of substrate and structuring layer is set by controlling the composition of an etching gas; and a wet-chemical etching method, wherein a ratio of the etching rates of substrate and structuring layer is set by controlling the composition of an etching medium.

The different method alternatives can also be combined with one another. By way of example, the structured structuring layer having a sidewall steepness in the range of 10° to 90° can also be provided in the case of a reactive dry etching method or in the case of a wet-chemical etching method.

In the case of a reactive dry etching method, the oxygen content of the etching gas can be controlled, for example. For example, a defined etching of the structuring layer is readily possible as a result.

In accordance with an aspect of the disclosure, a combination of an inert etching method and a reactive etching method is used for structuring the substrate.

In the case of such combined etching, the etching yield is achieved simultaneously by chemical and physical yield. The influencing possibilities described above can be combined as a result.

In accordance with an aspect of the disclosure, an etching method with a predefined longitudinal etching angle in the range of 0° to 60° is used for structuring the substrate.

In accordance with an aspect of the disclosure, an etching method with a predefined transverse etching angle in the range of 0° to 60° is used for structuring the substrate.

A longitudinal etching angle should be understood to mean the etching angle in a plane which extends perpendicularly to the substrate and which is defined by the groove direction of the grating structure.

A transverse etching angle should be understood to mean an etching angle in a plane which extends perpendicularly to the substrate, perpendicular to the groove direction of the grating structure.

In accordance with an aspect of the disclosure, an ion beam for etching, for example for structuring the substrate, can be tilted about an axis extending perpendicularly to the local surface of the substrate and, during the etching process, can be rotated about the axis extending perpendicularly to the surface of the substrate. By this approach, too, it is possible to structure the substrate in order to produce a grating structure having a defined edge steepness.

In accordance with an aspect of the disclosure, at least one of the following parameters is controlled in a targeted manner for setting the sidewall steepness of the structuring layer:

focusing of a laser beam, exposure time of a contact lithography method, distance of a proximity exposure, design of a mask, in particular of a holographic mask, wavelength of an exposure method;

intensity of the exposure in a lithography process for structuring the structuring layer;

duration of the development of a lithography process for structuring the structuring layer; and hard bake and/or reflow.

As a result, the sidewall steepness of the structuring layer can be influenced, for example set flexibly and precisely.

The disclosure also seeks to provide an improved illumination optical unit and an illumination system for a projection exposure apparatus, and also a projection exposure apparatus.

Aspects of the disclosure include an illumination optical unit and an illumination apparatus and respectively a projection exposure apparatus comprising a mirror in accordance with the description above. Corresponding advantages as those described above are possible.

The disclosure further seeks to provide an improved method for producing a microstructured or nanostructured component, and such a component.

Aspects of the disclosure include providing a projection exposure apparatus in accordance with the description above. With regard to potential advantages, reference can be made to the description above.

BRIEF DESCRIPTION OF THE DRAWINGS

Features and details of the disclosure are evident from the description of a plurality of exemplary embodiments with reference to the figures. In the figures.

DESCRIPTION OF EXEMPLARY EMBODIMENTS

Firstly, the general construction of a microlithographic projection exposure apparatus 1 will be described.

Figure 1:
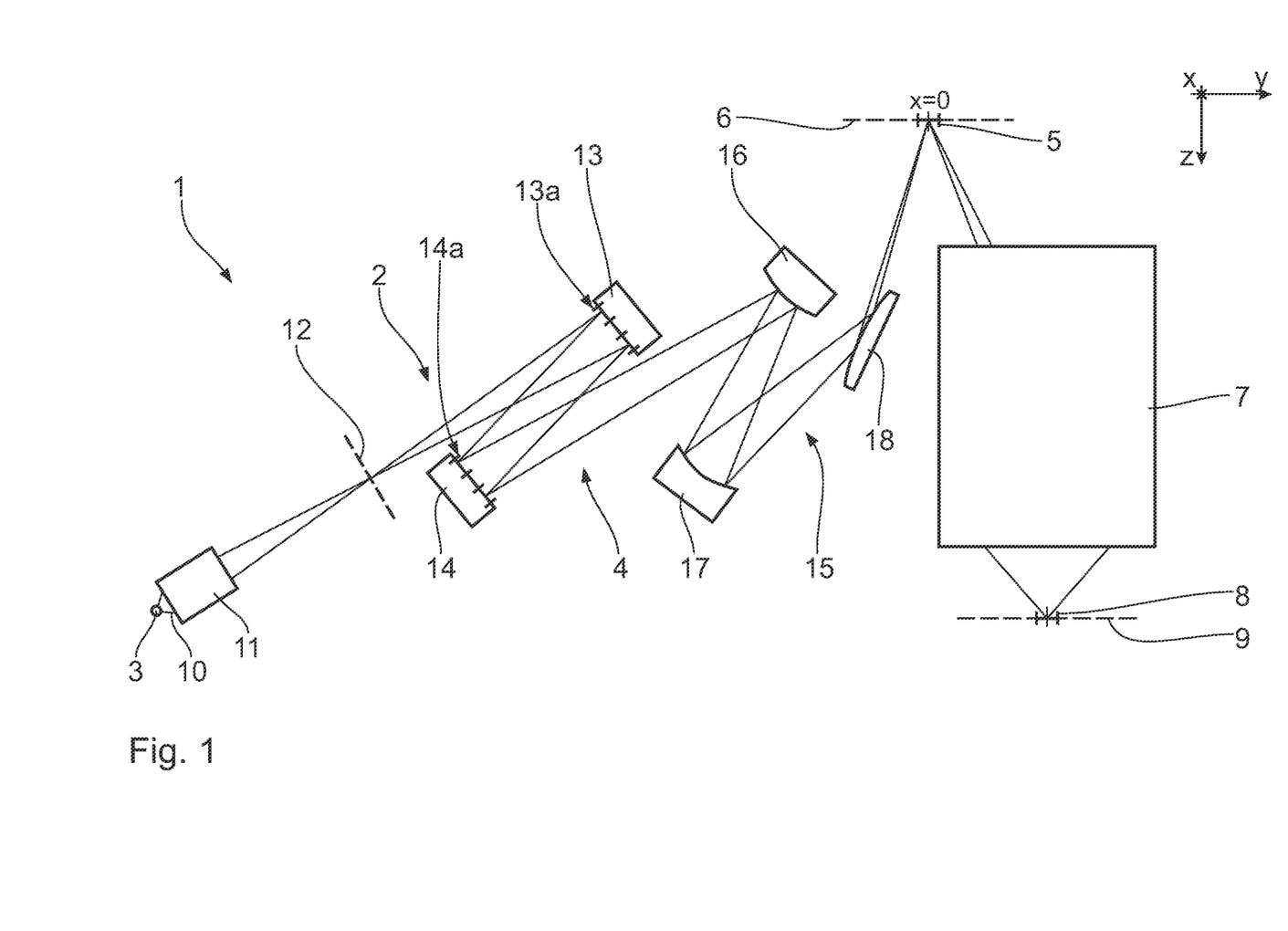
FIG. 1 schematically shows a meridional section through a projection exposure apparatus for EUV projection lithography.

FIG. 1 schematically shows a microlithographic projection exposure apparatus 1 in a meridional section. An illumination system 2 of the projection exposure apparatus 1 has, besides a radiation source 3, an illumination optical unit 4 for the exposure of an object field 5 in an object plane 6. In this case, a reticle arranged in the object field 5 and not illustrated in the drawing, the reticle being held by a reticle holder (likewise not illustrated), is exposed. A projection optical unit 7 serves for imaging the object field 5 into an image field 8 in an image plane 9. A structure on the reticle is imaged onto a light-sensitive layer of a wafer arranged in the region of the image field 8 in the image plane 9, the wafer likewise not being illustrated in the drawing and being held by a wafer holder (likewise not illustrated).

The radiation source 3 is an EUV radiation source having an emitted used radiation in the range of between 5 nm and 30 nm. This may be a plasma source, for example a GDPP (gas discharge-produced plasma) source or an LPP (laser-produced plasma) source. By way of example, tin can be excited to form a plasma using a carbon dioxide laser operating at a wavelength of 10.6 m, that is to say in the infrared range. A radiation source based on a synchrotron can also be used for the radiation source 3. Information about such a radiation source can be found by the person skilled in the art for example in U.S. Pat. No. 6,859,515 B2. EUV radiation 10 emerging from the radiation source 3 is focused by a collector 11. A corresponding collector is known from EP 1 225 481 A. Downstream of the collector 11, the EUV radiation 10 propagates through an intermediate focal plane 12 before being incident on a field facet mirror 13 with a multiplicity of field facets 13a. The field facet mirror 13 is arranged in a plane of the illumination optical unit 4 which is optically conjugate with respect to the object plane 6.

The EUV radiation 10 is also referred to hereinafter as illumination light or as imaging light.

Downstream of the field facet mirror 13, the EUV radiation 10 is reflected by a pupil facet mirror 14 with a multiplicity of pupil facets 14a. The pupil facet mirror 14 is arranged in a pupil plane of the illumination optical unit 4, which is optically conjugate with respect to a pupil plane of the projection optical unit 7. With the aid of the pupil facet mirror 14 and an imaging optical assembly in the form of a transfer optical unit 15 comprising mirrors 16, 17 and 18 designated in the order of the beam path, field individual facets 19 of the field facet mirror 13, which are also referred to as subfields or as individual-mirror groups and are described in even greater detail below, are imaged into the object field 5. The last mirror 18 of the transfer optical unit 15 is a mirror for grazing incidence ("grazing incidence mirror").

Figure 2:
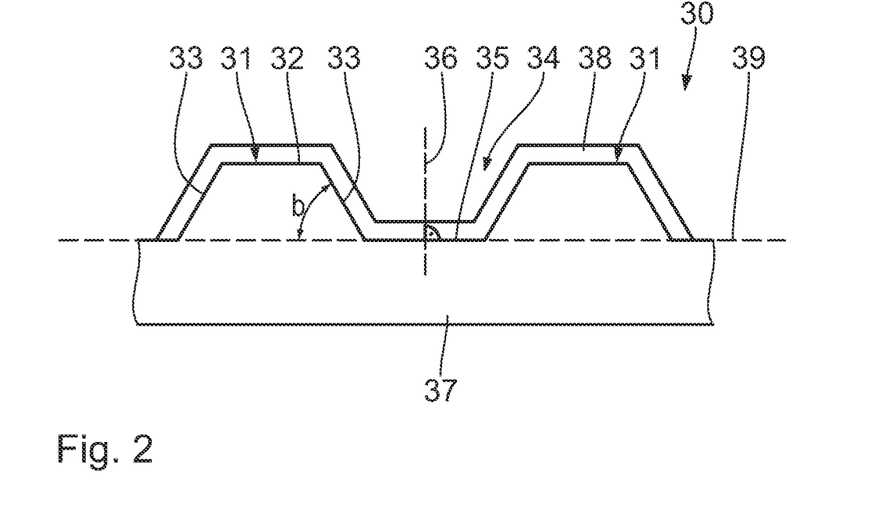
FIG. 2 shows a schematic illustration of a mirror comprising a spectral filter in the form of a grating structure.

FIG. 2 illustrates by way of example and schematically the reflection surface of a mirror comprising a spectral filter in the form of a grating structure 30. The grating structure 30 serves as a spectral filter for masking out radiation having wavelengths in a predefined range, in particular for masking out wavelengths in the infrared range.

The grating structure 30 comprises a plurality of grating ridges 31. The grating ridges 31 each have a front side 32 and sidewalls 33. Grooves 34 are in each case formed between the grating ridges 31. The grooves 34 each have a bottom 35.

The grating ridges 31 each have in particular a trapezoid-shaped cross section. The cross section can correspond to an isosceles trapezoid or a non-isosceles trapezoid. It is non-rectangular, in particular. It is non-triangular, in particular.

That area proportion of the total reflection surface area of the mirror, in particular of the total area of the grating structure 30, which is constituted by the sidewalls 33, in plan view, in particular in perpendicular projection, is at most 10%, in particular at most 5%, in particular at most 3%, in particular at most 2%, in particular at most 1%, in particular at most 0.5%, in particular at most 0.3%.

Instead of a trapezoid-shaped cross section, the grating ridges 31 can generally also have a cross section having a trapezoid-shaped smallest convex envelope. In principle, the front side 32 of the grating ridges 31 need not be oriented parallel to the bottom 35 of the adjacent grooves 34.

Between the front side 32 of the grating ridges 31 and the bottom 35 of the grooves 34, there is an offset V in the direction of a surface normal 36 with respect to the substrate 37. The offset V is, in particular, in the region of one quarter wavelength in the infrared range. The offset V is, in particular, in the range of 1 micrometer to 10 micrometers. Other values are likewise possible.

The offset V is also referred to as the groove depth of the grating structure 30. For further details, reference should be made to DE 10 2012 010 093 A1.

According to the disclosure, it has been recognized that an embodiment of the grating ridges 31 with steep or even negative sidewalls has the effect that after a protective layer 38 has been applied, the substrate is not completely enclosed by the protective layer 38. This can have the effect that the substrate is attacked in an aggressive atmosphere, in particular in an atmosphere comprising ionized hydrogen. The hydrogen can lead, in particular, to the substrate 37 breaking up or to stresses that can cause layer detachments.

According to the disclosure, it has therefore been recognized that it is advantageous if the sidewalls 33 each have a sidewall steepness b in the range of 15° to 60°. In this case, the sidewall steepness b, also referred to as edge steepness, is measured in relation to a local tangential plane 39 in the region of the bottom 35 of the groove 34 adjacent to the sidewall 33 (see FIG. 3).

Figure 3:
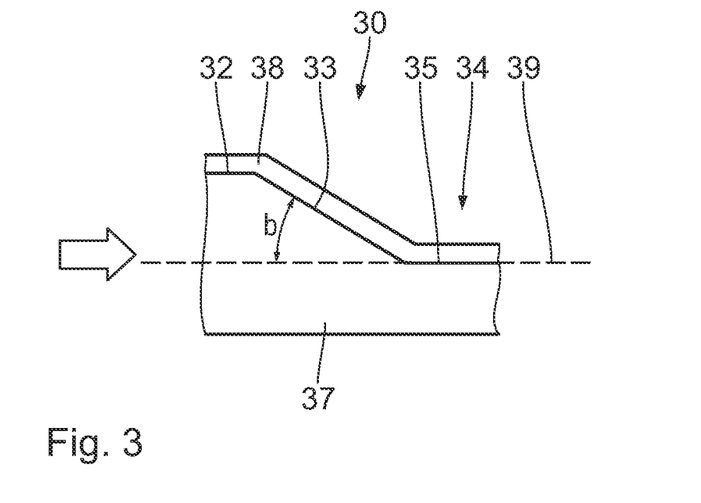
FIG. 3 schematically shows an excerpt from a grating structure in the region of the edge of a grating ridge.

Such a defined sidewall steepness b has the effect that it is possible to ensure that the protective layer 38 is closed, in particular covers the substrate 37 completely and without gaps.

A description is given below of various variants regarding how sidewalls 33 having a defined sidewall steepness b can be produced using suitable process implementation, in particular during the structuring of a structuring layer 40, in particular with the aid of a lithography process, and/or during the etching of the structuring layer 40 and of the substrate 37, in particular.

In particular, a layer composed of photoresist (PR) serves as the structuring layer 40. The layer can be structured flexibly and precisely via a structuring step, for example via a lithographic method.

Figure 4A:
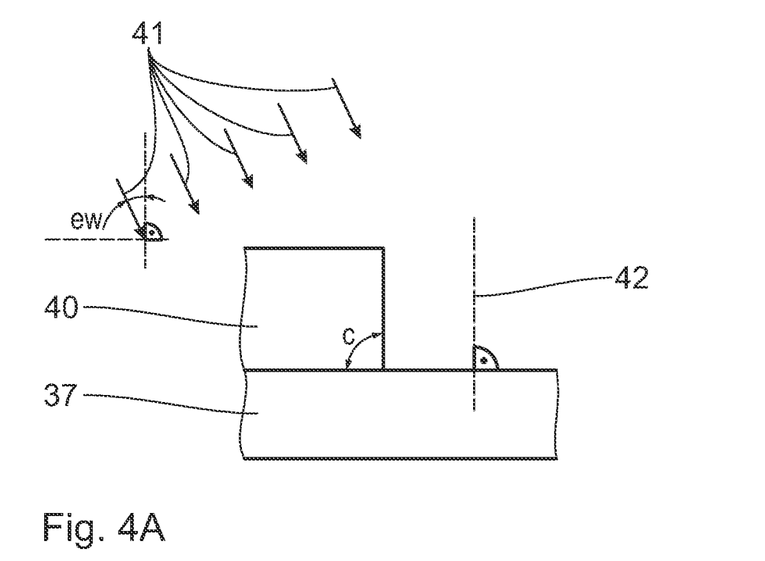
FIG. 4A schematically shows a first variant of a method for structuring a substrate.

FIG. 4A schematically illustrates an inert dry etching method for structuring the substrate 37. In a method of this type, etching is carried out in a vacuum using accelerated directional ions, wherein the material removal is produced purely physically via corrosions. In this case, there are in principle two possibilities for setting the sidewall steepness b. In the variant illustrated in FIG. 4A, the sidewall steepness b is influenced by an angle ew of incidence of the ions. The angle ew of incidence is also referred to as the etching angle. In this case, the ion beam 41 can be tilted parallel to the orientation of the grooves 34. This is also referred to as longitudinal tilting. The ion beam 41 can also be tilted transversely with respect to the orientation of the grooves 34. This is referred to as transverse tilting. It is also possible to tilt the ion beam 41 in relation to a surface normal 42 with respect to the substrate 37 and to rotate the tilted ion beam 41 about the surface normal 42.

Figure 4B:
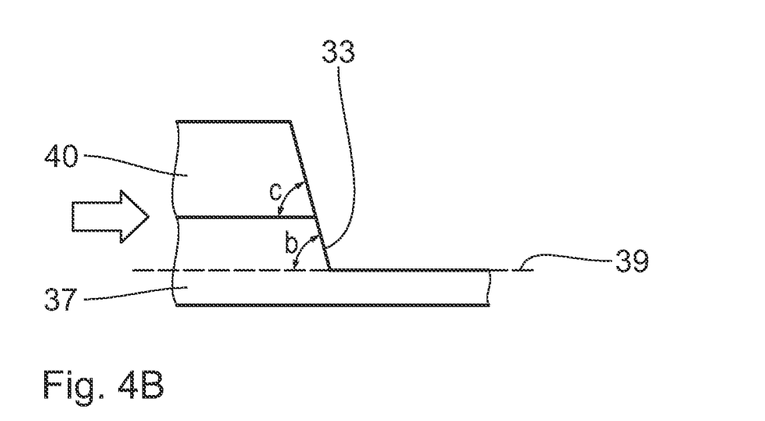
FIG. 4B shows by way of example a schematic illustration of the substrate structured via the method in accordance with FIG. 4A with a structuring layer applied thereon.

On account of the shading by the structuring layer 40, a sidewall 33 having a sidewall steepness b of less than 90° is formed (see FIG. 4B). The sidewall steepness b can be influenced, in particular set, by the choice of the angle ew of incidence.

In the case of inert dry etching, the sidewall steepness b can also be influenced by virtue of the structuring layer 40 and the substrate 37 having different etching rates. This is illustrated by way of example in FIGS. 5A to 5C. As is evident in particular from the intermediate product (see FIG. 5B), differences in the etching rates lead to an influencing of the sidewall steepness b. In this figure and the subsequent figures, the etched region is illustrated in a hatched manner in each case.

Figure 5A:
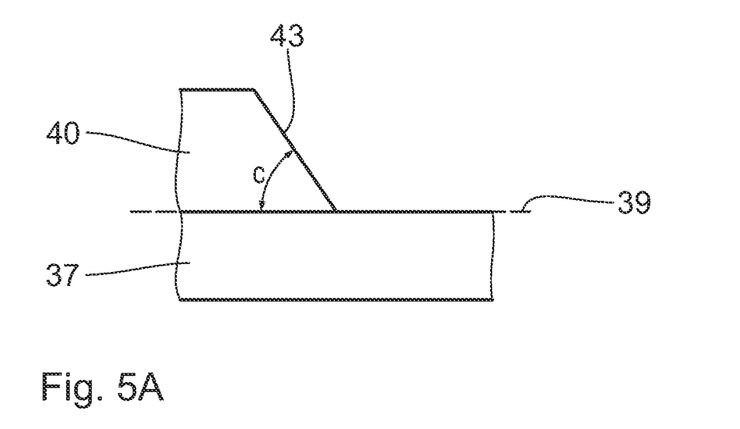
FIGS. 5A to 5C schematically show an alternative variant of a method for structuring a substrate with an initial state (FIG. 5A), an intermediate product (FIG. 5B) and the finished structured substrate (FIG. 5C)
Figure 5B:
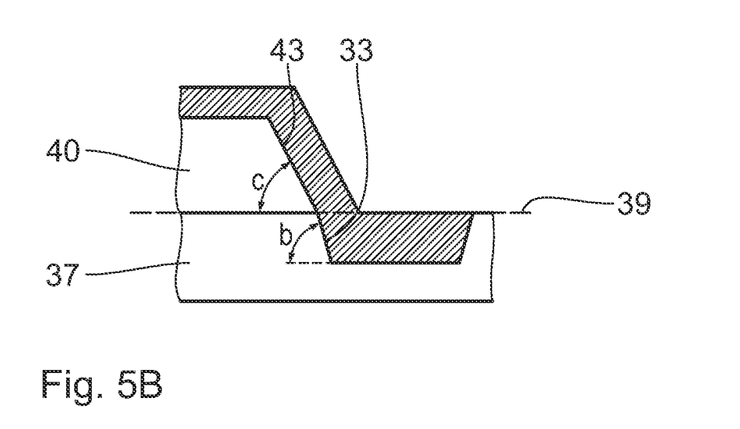
Figure 5C:
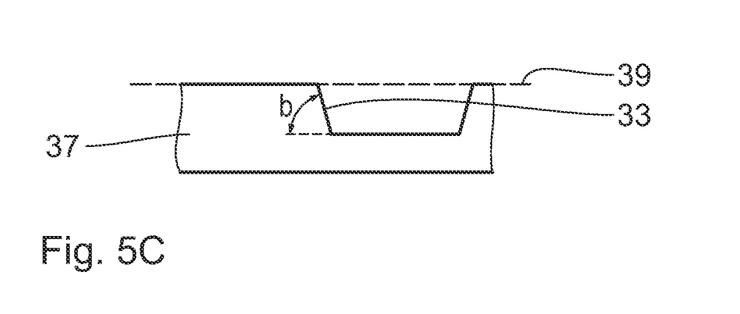

Different etching rates can be achieved, in particular, by the selection of different resists for the structuring layer 40.

In addition to the influence of different etching rates, the sidewall steepness b can be influenced, in particular set, here by the steepness c of a sidewall 43 of the structuring layer 40. The steepness c is also referred to as the resist steepness. It can be chosen flexibly and precisely in the lithography step for structuring the structuring layer 40.

Moreover, in this variant, too, the sidewall steepness b can be influenced, in particular set, by the choice of etching angle.

In the case of a reactive dry etching method, etching is carried out in a vacuum using accelerated directional ions, wherein the material removal takes place to the greatest possible extent by way of chemical reactions of the ions with the materials of the surface. In this case, the sidewall steepness b can be set by targeted selection of the chemical components. Possible etching gases here are $O_2$ ($C_{12}$, $Sf_6$, $CF_4$, $CHF_3$, $O_2$, $C_2F_6$, $CF_6$, $SIC_{14}$, $BC_{13}$) and a mixture thereof.

Figure 6A:
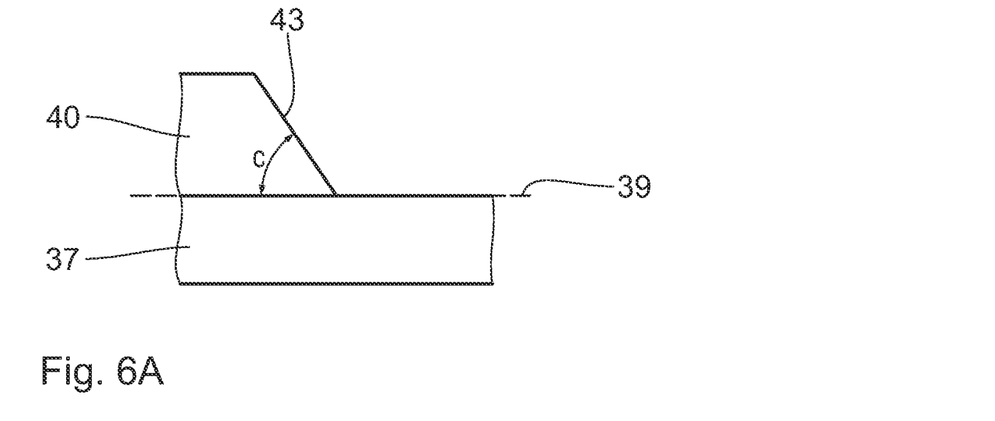
FIGS. 6A to 6C show a further variant of a method for structuring a substrate with an initial state (FIG. 6A), an intermediate product (FIG. 6B) and the finished structured substrate (FIG. 6C) for the case where the etching rate is lower in the structuring layer than in the substrate.
Figure 6B:
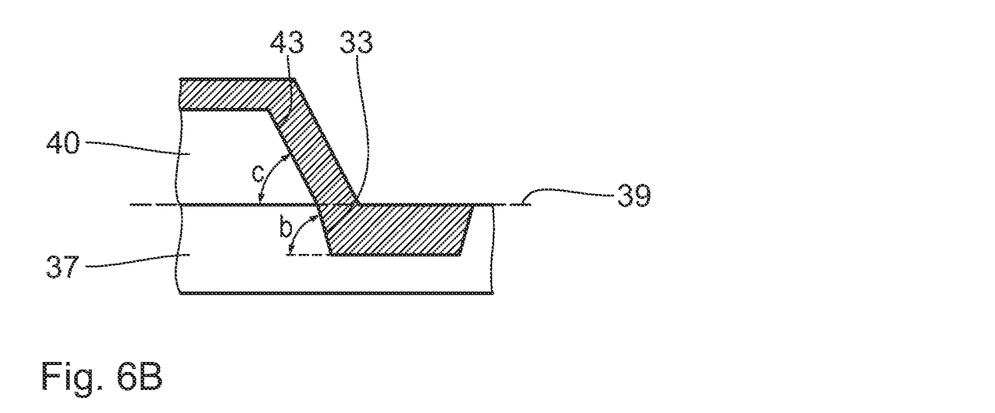
Figure 6C:
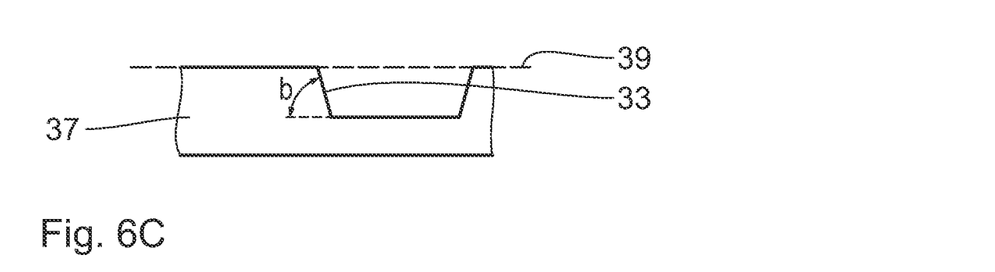
Figure 7A:
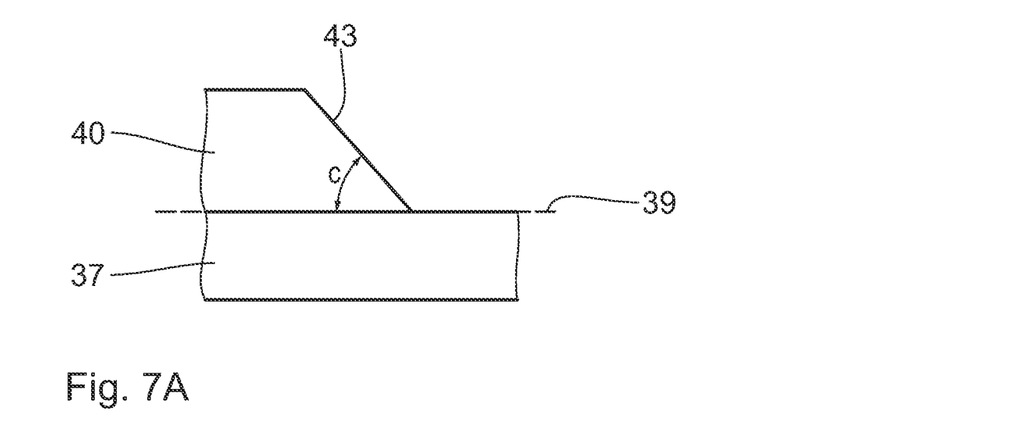
FIGS. 7A to 7C show a further variant of a method for structuring a substrate with an initial state (FIG. 7A), an intermediate product (FIG. 7B) and the finished structured substrate (FIG. 7C) for the case where the etching rate is higher in the structuring layer than in the substrate.
Figure 7B:
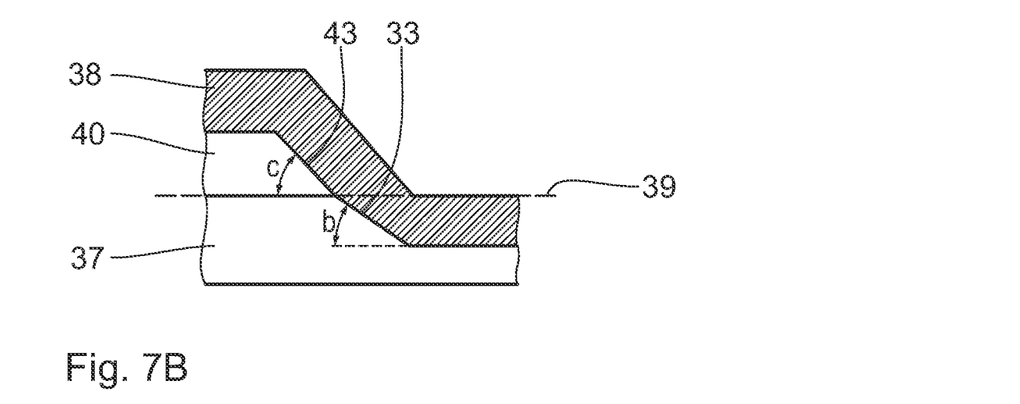
Figure 7C:
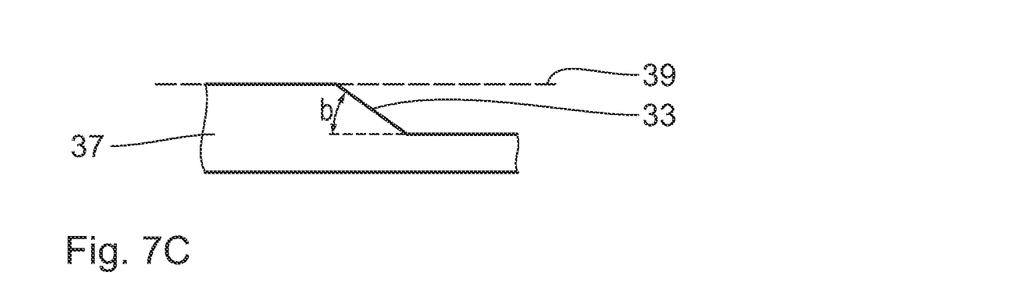

By way of example, a defined etching of the structuring layer 40 is settable using a targeted selection of the composition of the etching gas, for example by changing the oxygen content thereof. The etching rate of the structuring layer 40 can be lower (FIGS. 6A to 6C), or higher (FIGS. 7A to 7C), than the etching rate of the substrate 37.

A given sidewall steepness c of the sidewalls 43 of the structuring layer 40 can thus lead to a flatter or steeper sidewall steepness in the substrate 37.

Combined etching is also possible. In the case of combined etching, the etching removal is achieved simultaneously with chemical and physical removal. This can be achieved for example by using reactive etching gases and applying them directionally and in an accelerated manner onto the surface of the substrate 37 with the structuring layer 40 applied thereon. It is thereby possible to combine the variants described above, in particular the influencing possibilities for setting the sidewall steepness b.

Figure 8A:
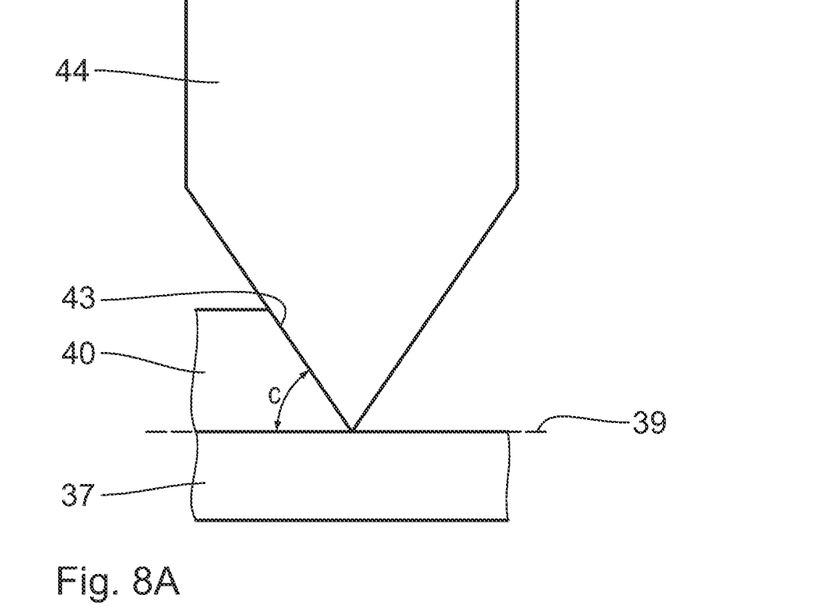
FIGS. 8A and 8B show by way of example schematic illustrations for elucidating the influence of the focusing of a laser beam on the structuring of the structuring layer.

The sidewall steepness c of the sidewalls 43 of the structuring layer 40 can be influenced by various factors in the lithography process. It can be influenced, in particular, by the intensity of the exposure in the lithography process. It can be influenced by targeted focusing of a laser beam 44 (see FIG. 8A).

Figure 8B:
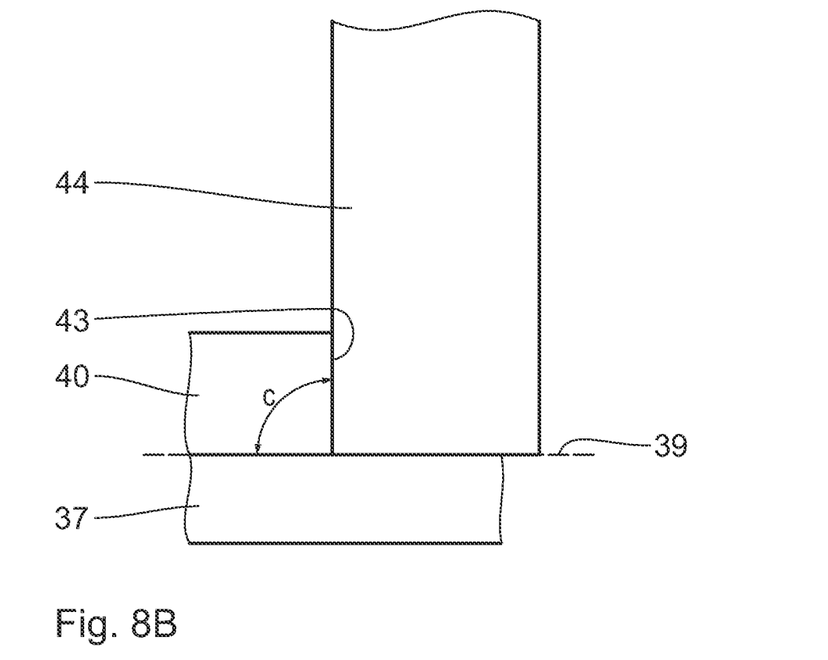

By using a collimated laser beam 44, it is possible to achieve a higher sidewall steepness c in the structuring layer 40 (see FIG. 8B).

Figure 9:
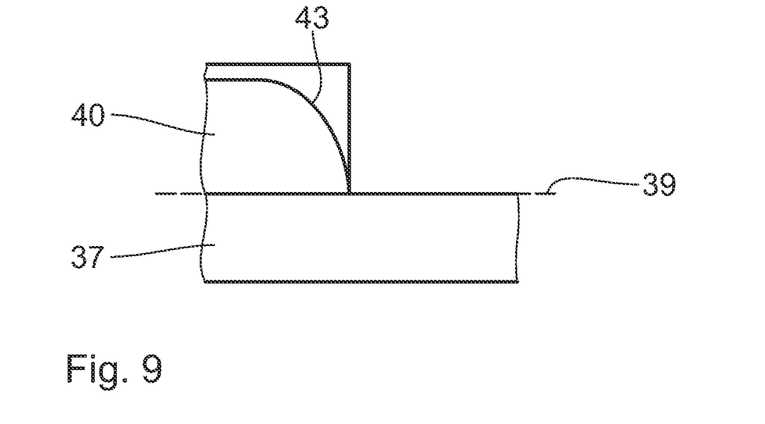
FIG. 9 schematically shows an illustration for elucidating the effect of a lengthened development duration on the sidewall steepness of a structuring layer.

The development operation of the lithography process for structuring the structuring layer 40 also influences the sidewall steepness c of the resist structure. A dark removal of the resist also always takes place during the development of the exposed structuring layer 40. The dark removal results in edge rounding. FIG. 9 illustrates by way of example pronounced edge rounding as a consequence of a lengthened development duration.

Figure 10A:
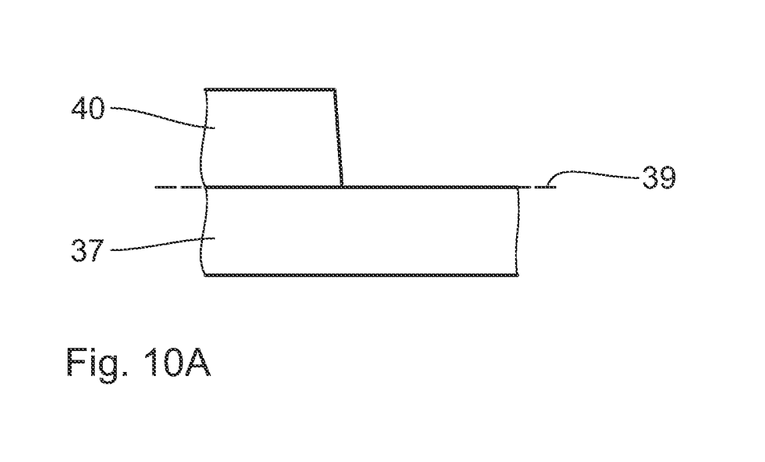
FIG. 10A schematically shows an excerpt from a substrate with structuring layer without hard bake.
Figure 10B:
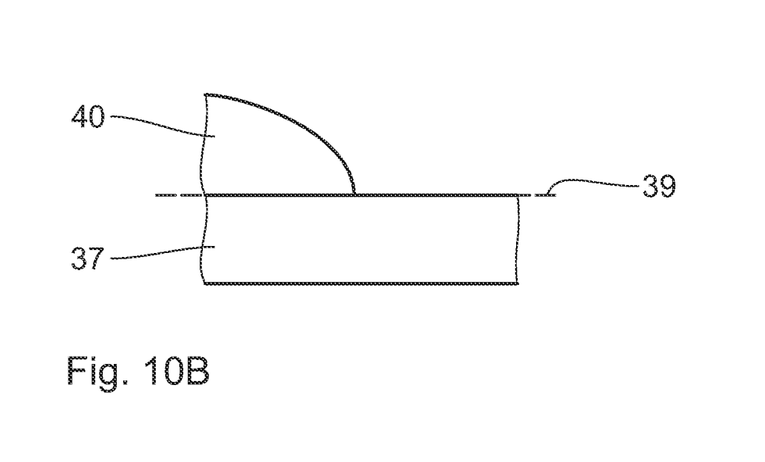
FIG. 10B shows an illustration in accordance with FIG. 10A after a hard bake.

Hard bake and reflow can also be used in a targeted manner for influencing the sidewall steepness c of the structuring layer 40. Thermal reflow of developed photoresist structures can be used in a targeted manner for structuring the structuring layer 40 and thus for influencing the sidewall steepness b of the grating ridges 31 that is produced via a dry etching method, for example. A hard bake results, in particular, in spherical or cylindrical rounding of the resist edges. FIG. 10A illustrates by way of example a substrate 37 with a structured structuring layer 40 applied thereon without or before a hard bake. FIG. 10B illustrates the corresponding structure having been thermally rounded after a hard bake.

Different etching rates of the structuring layer 40 and of the substrate 37 can be achieved in the case of a wet-chemical etching method as well. A corresponding influencing of the sidewall steepness b as in the case of the inert dry etching method in accordance with FIG. 5B is thus customary.

Figure 11:
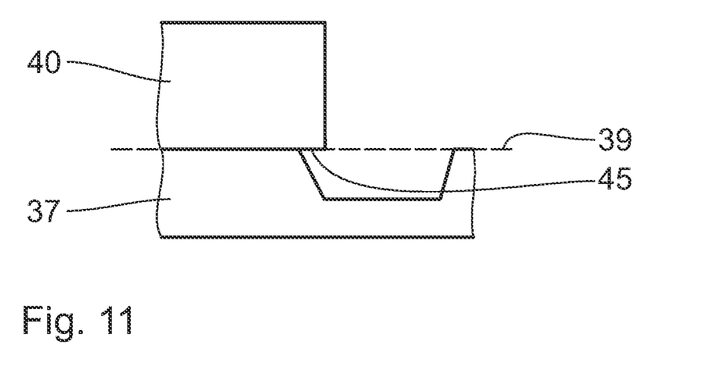
FIG. 11 schematically shows an illustration of an excerpt from a substrate with applied structuring layer after isotropic, wet-chemical etching.

In the case, too, of isotropic, diffusion-limited etching of the substrate 37, the sidewall steepness b can be influenced in a targeted manner. In the case of a method of this type, the extent of an undercut region 45 is dependent, in particular, on the intermixing of the etching solution.

After the structuring of the substrate 37, the grating structure 30 is provided with the closed protective layer 38. The protective layer 38 is applied in particular on the substrate 37. It can be deposited in particular on the substrate 37. It is also possible to allow the protective layer 38 to grow on the substrate 37.

In particular, a molybdenum-silicon double-ply structure can serve as the protective layer. Details of such a layer stack are known from the prior art.

With the aid of the projection exposure apparatus 1, at least one part of the reticle in the object field 5 is imaged onto a region of a light-sensitive layer on the wafer in the image field 8 for the lithographic production of a microstructured or nanostructured component, in particular of a semiconductor component, for example of a microchip. Depending on the embodiment of the projection exposure apparatus 1 as a scanner or as a stepper, the reticle and the wafer are moved in a temporally synchronized manner in the y-direction continuously in scanner operation or step by step in stepper operation.

What is claimed is:

1. A mirror, comprising:
   a reflection surface comprising a spectral filter which comprises a grating structure,
   wherein:
   the grating structure comprises a plurality of grating ridges;
   for each grating ridge, the grating ridges comprises a front side and sidewalls;
   for each of at least some pairs of adjacent grating ridges:
   a groove comprising a bottom is between the adjacent grating ridges;
   a depth of the groove is a distance between the bottom and the adjacent grating ridges; and
   the depth is configured to mask out infrared radiation;
   the grating structure has a maximum edge steepness in the range of 15° to 60°; and
   the mirror is selected from the group consisting of a condenser mirror and a collector mirror.

2. The mirror of claim 1, further comprising a closed protective layer covering the grating structure.

3. The mirror of claim 2, wherein:
   the protective layer comprises a plurality of double plies; and
   each double plie comprises molybdenum and silicon.

4. The mirror of claim 3, wherein the protective layer comprises at least 10 double plies.

5. The mirror of claim 3, wherein the double plies are in the form of a stack without interruptions between the double plies.

6. The mirror of claim 3, further comprising a substrate, wherein:
   the substrate has the grating structure; and
   the substrate comprises at least one member selected from the group consisting of amorphous silicon, nickel-phosphorus, silicon dioxide, titanium, platinum, gold, aluminium, titanium oxide, nickel, copper, silver, tantalum and aluminium oxide.

7. The mirror of claim 6, wherein, for each of the at least some pairs of adjacent ridges, the depth of the groove is from one micron to 10 microns.

8. The mirror of claim 6, wherein, for each of at least some of the grating ridges, the grating ridge has a cross section having a trapezoid-shaped smallest convex envelope.

9. The mirror of claim 1, further comprising a substrate, wherein:
   the substrate has the grating structure; and
   the substrate comprises at least one member selected from the group consisting of amorphous silicon, nickel-phosphorus, silicon dioxide, titanium, platinum, gold, aluminium, titanium oxide, nickel, copper, silver, tantalum and aluminium oxide.

10. An optical unit, comprising:
    a mirror according to claim 1,
    wherein the optical unit is a projection lithography illumination optical unit.

11. A system, comprising:
    a projection lithography illumination optical unit which comprises a mirror according to claim 1; and
    a radiation source configured to generate illumination radiation.

12. An apparatus, comprising:
    an illumination optical unit comprising a mirror according to claim 1; and a projection optical unit configured to image an object field into an image field, wherein the apparatus is a microlithographic projection exposure apparatus.

13. A method of using a projection exposure system comprising an illumination optical system and an imaging optical system, the method comprising:

using the illumination optical system to illuminate a region of a reticle in an object field of the imaging optical system; and using the imaging optical to project at least a part of the illuminated reticle onto a region of a light-sensitive material in an object field of the imaging optical system, wherein the illumination optical system comprises a mirror according to claim 1.

14. The mirror of claim 1, wherein the mirror is a condenser mirror.

15. The mirror of claim 1, wherein the mirror is a collector mirror.

16. The mirror of claim 1, further comprising a substrate, wherein the substrate comprises at least one member selected from the group consisting of amorphous silicon, nickel-phosphorus, silicon dioxide, titanium, platinum, gold, aluminium, titanium oxide, nickel, copper, silver, tantalum and aluminium oxide.

17. A method, comprising:

structuring a structuring layer applied on a substrate of a mirror body; and structuring the substrate of the mirror body, wherein structuring the substrate of the mirror body comprises at least one member selected from the group consisting of:

etching with an etching angle in the range of 0° to 60°;

etching, wherein the structuring layer and the substrate of the mirror body have different etching rates; and etching, wherein the structuring layer is provided with a sidewall steepness in the range of 10° to 90° during the structuring; and applying a closed protective layer on the substrate, wherein:

the grating structure comprises a plurality of grating ridges;

for each grating ridge, the grating ridges comprises a front side and sidewalls;

for each of at least some pairs of adjacent grating ridges:

a groove comprising a bottom is between the adjacent grating ridges;

a depth of the groove is a distance between the bottom and the adjacent grating ridges; and the depth of the groove is configured to mask out infrared radiation; and the grating structure has a maximum edge steepness in the range of 15° to 60°.

18. The method of claim 17, wherein structuring the substrate of the mirror body comprises at least one member selected from the group consisting of:

inert dry etching with an etching angle in the range of 0° to 60°;

inert dry etching, wherein the structuring layer and the substrate of the mirror body have different etching rates;

inert dry etching, wherein the structuring layer is provided with a sidewall steepness in the range of 0° to 60° during structuring;

reactive dry etching comprising controlling a composition of an etching gas to set a ratio of the etching rates of substrate of the mirror body and structuring layer; and wet chemical etching comprising controlling a composition of an etching medium to set a ratio of the etching rates of substrate of the mirror body and the structuring layer.

19. The method of claim 17, wherein structuring the substrate of the mirror body comprises using a combination of inert etching and reactive etching.

20. The method of claim 17, wherein structuring the substrate of the mirror body comprises etching method with a longitudinal etching angle in the range of 0° to 60°.

21. The method of claim 17, wherein structuring the substrate of the mirror body comprises etching method with a transverse etching angle in the range of 0° to 60°.

22. The method of claim 17, further comprising setting a sidewall steepness of the structuring layer by controlling at least one parameter in a targeted manner, wherein the at least one parameter comprises at least one member selected from the group consisting of a focusing a laser beam for structuring the structuring layer, an intensity of the exposure in a lithography process for structuring the structuring layer, a duration of the development of a lithography process for structuring the structuring layer, a hard bake of the structuring layer after a structuring thereof, a re-flow of the structuring layer after a structuring thereof, and a temperature of the structuring layer after a structuring thereof.

23. The method of claim 17, further comprising setting a sidewall steepness of the structuring layer.

24. The method of claim 17, wherein, for each of the at least some pairs of adjacent ridges, the depth of the groove is from one micron to 10 microns.

* * * * *

UNITED STATES PATENT AND TRADEMARK OFFICE
CERTIFICATE OF CORRECTION

PATENT NO. : 12,111,578 B2
APPLICATION NO. : 17/317417
DATED : October 8, 2024
INVENTOR(S) : Christof Jalics et al.

It is certified that error appears in the above-identified patent and that said Letters Patent is hereby corrected as shown below:

In the Specification

Column 3, Line 29, delete "150" insert -- 15° --.

Column 3, Line 30, delete "10)" insert -- 1°) --.

Column 3, Line 56, delete "100" insert -- 10° --.

Column 3, Line 57, delete "900" insert -- 90° --.

Column 4, Line 20, delete "100" insert -- 10° --.

Column 4, Line 20, delete "900" insert -- 90° --.

Column 6, Line 40, delete "m," insert -- μm, --.

Column 7, Line 17-18, delete "nonrectangular," insert -- non-rectangular, --.

Column 8, Line 53, delete "Sf$_6$" insert -- SF$_6$ --.

Column 8, Line 54, delete "SIC$_{14}$," insert -- SiCl$_4$, --.

Signed and Sealed this
Twenty-fourth Day of December, 2024

Derrick Brent
*Acting Director of the United States Patent and Trademark Office*